United States Patent
Choi et al.

(10) Patent No.: US 10,224,102 B2
(45) Date of Patent: Mar. 5, 2019

(54) SEMICONDUCTOR MEMORY DEVICE AND OPERATION METHOD THEREOF

(71) Applicant: SK hynix Inc., Icheon-si Gyeonggi-do (KR)

(72) Inventors: Gil Bok Choi, Daejeon (KR); Sung Hoon Cho, Bucheon-si (KR); Sung Ho Kim, Cheongju-si (KR); Min Sang Park, Cheongju-si (KR); Kyong Taek Lee, Yongin-si (KR); Myoung Kwan Cho, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/835,898

(22) Filed: Dec. 8, 2017

(65) Prior Publication Data
US 2018/0336949 A1    Nov. 22, 2018

(30) Foreign Application Priority Data
May 16, 2017    (KR) .......................... 10-2017-0060596

(51) Int. Cl.
*G11C 16/04*    (2006.01)
*G11C 16/10*    (2006.01)

(52) U.S. Cl.
CPC .............. *G11C 16/04* (2013.01); *G11C 16/10* (2013.01); *G11C 2216/14* (2013.01)

(58) Field of Classification Search
CPC .............. G11C 15/00; G11C 11/40611; G11C 11/40615; G11C 11/40618; G11C 11/40626; G11C 11/4063; G11C 29/50016; G11C 7/00; G11C 13/0011; G11C 13/0023; G11C 13/003
USPC ...... 365/189.07, 49.17, 222, 49.1, 148, 158, 365/189.02, 189.05, 189.15, 221, 236
See application file for complete search history.

(56) References Cited

U.S. PATENT DOCUMENTS

2013/0279283 A1* 10/2013 Seo ................... G11C 11/40611
365/222

FOREIGN PATENT DOCUMENTS

KR    1020100079892 A    7/2010
KR    1020140073816 A    6/2014

* cited by examiner

*Primary Examiner* — Thong Q Le
(74) *Attorney, Agent, or Firm* — William Park & Associates Ltd.

(57) ABSTRACT

A semiconductor memory device may include a control logic. The control logic may be coupled to bit lines through a read and write (read/write) circuit and to word lines. The control logic is configured to determine a duration of an activation time of a strobe signal for the read/write circuit.

27 Claims, 12 Drawing Sheets

SEMICONDUCTOR MEMORY DEVICE AND OPERATION METHOD THEREOF

CROSS-REFERENCE TO RELATED APPLICATION

The present application claims priority under 35 U.S.C. § 119(a) to Korean patent application number 10-2017-0060596 filed on May 16, 2017 in the Korean Intellectual Property Office, the entire disclosure of which is incorporated herein by reference.

BACKGROUND

1. Technical Field

An aspect of the present disclosure may relate to an electronic device, and more particularly, to a semiconductor memory device and an operation method thereof.

2. Related Art

Memory devices may be formed in a two-dimensional structure in which strings are arranged horizontally with respect to a semiconductor substrate, or be formed in a three-dimensional structure in which strings are arranged vertically with respect to a semiconductor substrate. A three-dimensional semiconductor device is a memory device devised in order to overcome the limit of degree of integration in two-dimensional semiconductor devices, and may include a plurality of memory cells vertically stacked on a semiconductor substrate.

SUMMARY

According to an aspect of the present disclosure, there may be provided a semiconductor memory device. The semiconductor memory device may include a memory cell array including a plurality of memory blocks. The semiconductor memory device may include a read/write circuit configured to read data from the memory cell array. The semiconductor memory device may include a control logic configured to control the read/write circuit to perform a read operation on the memory cell array. The control logic may be configured to perform a read operation by applying different activation times of strobe signals according to the position of a word line connected to a memory block.

According to an aspect of the present disclosure, there may be provided a method of operating a semiconductor memory device. The method may include grouping a plurality of word lines coupled to a memory block of the semiconductor memory device into a plurality of word line groups. The method may include determining activation times of strobe signals according to temperatures, with respect to each of the word line groups. The method may include storing the determined activation times of the strobe signals in a lookup table of the semiconductor memory device.

According to an aspect of the present disclosure, there may be provided a method of operating a semiconductor memory device. The method may include receiving a read command and an address. The method may include receiving a temperature measurement result of the semiconductor memory device. The method may include determining an activation time of a strobe signal, based on the temperature measurement result and the position of a word line corresponding to the address, with reference to a lookup table. The method may include performing a read operation, based on the determined activation time of the strobe signal.

According to an aspect of the present disclosure, there may be provided a semiconductor memory device. The semiconductor memory device may include a plurality of memory cells coupled between word lines and bit lines. The semiconductor memory device may include a plurality of page buffers coupled to the bit lines, respectively, each of the page buffers configured to receive a strobe signal to read data from a memory cell in a read operation. The semiconductor memory device may include a control logic configured to determine a duration of an activation time of the strobe signal based on a position of a word line coupled to a memory cell to read data from and a temperature measurement result.

According to an aspect of the present disclosure, there may be provided a semiconductor memory device. The semiconductor memory device may include a control logic coupled to bit lines through a read and write (read/write) circuit and to word lines through an address decoder. The control logic may be configured to determine a duration of an activation time of a strobe signal for the read/write circuit based on a group a word line is included in and a temperature range associated with the duration of the activation time of the strobe signal.

According to an aspect of the present disclosure, there may be provided a semiconductor memory device. The semiconductor memory device may include a plurality of memory cells coupled between word lines and bit lines. The semiconductor memory device may include a plurality of page buffers coupled to the bit lines, respectively, each of the page buffers configured to receive a strobe signal to read data from a memory cell in a read operation. The semiconductor memory device may include a control logic configured to determine a duration of an activation time of the strobe signal based on a temperature measurement result and a group a word line is included in, the word line coupled to a memory cell from which data is to be read from by the page buffer.

DETAILED DESCRIPTION

Figure 1:
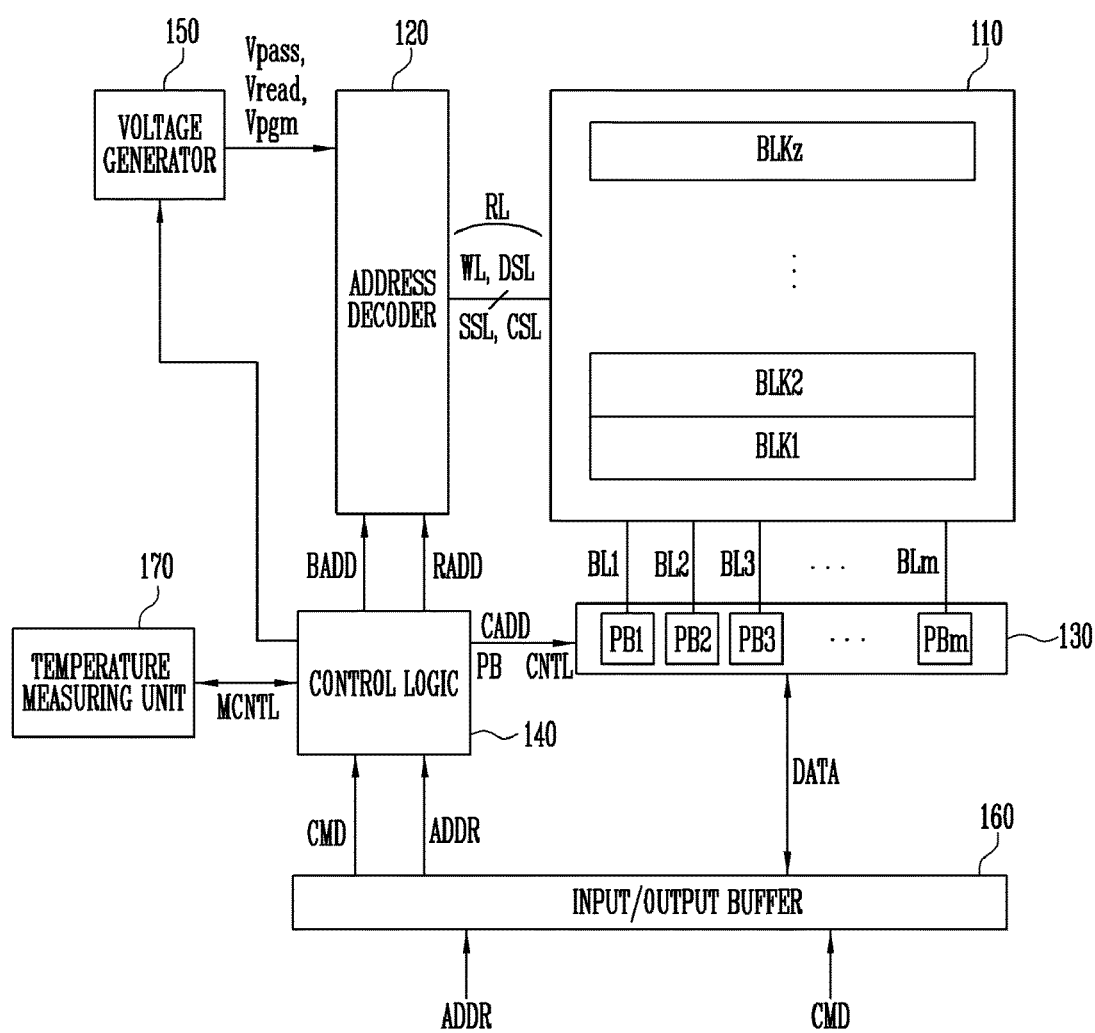
FIG. 1 is a block diagram illustrating a semiconductor memory device according to an embodiment of the present disclosure.

Hereinafter, examples of embodiments of the present disclosure will be described in detail with reference to the accompanying drawings. The same reference numerals are used to designate the same elements as those illustrated in other drawings. In the following descriptions, only portions necessary for understanding operations according to the examples of embodiments may be described, and descriptions of the other portions may be omitted to not obscure important concepts of the embodiments.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Embodiments may provide a semiconductor memory device having improved reliability.

Embodiments may provide an operation method of a semiconductor memory device having improved reliability.

FIG. 1 is a block diagram illustrating a semiconductor memory device 100 according to an embodiment of the present disclosure.

Referring to FIG. 1, the semiconductor memory device 100 includes a memory cell array 110, an address decoder 120, a read and write (read/write) circuit 130, a control logic 140, a voltage generator 150, an input and output (input/output) buffer 160, and a temperature measuring unit 170.

The memory cell array 110 includes a plurality of memory blocks BLK1 to BLKz. The plurality of memory blocks BLK1 to BLKz are coupled to the address decoder 120 through word lines WL. Although not illustrated in FIG. 1, other row lines RL such as a drain select line DSL, common source line CSL, and a source select line SSL, etc., may also be coupled to the plurality of memory blocks BLK1 to BLKz and the address decoder 120. The plurality of memory blocks BLK1 to BLKz are coupled to the read/write circuit 130 through bit lines BL1 to BLm.

Each of the plurality of memory blocks BLK1 to BLKz includes a plurality of memory cells. In an embodiment, the plurality of memory cells are nonvolatile memory cells. In an embodiment, the plurality of memory cells may be memory cells disposed in a two-dimensional arrangement. In this case, the plurality of memory blocks BLK1 to BLKz include memory cells disposed in a two-dimensional arrangement. In another embodiment, the plurality of memory cells may be memory cells disposed in a three-dimensional arrangement. In this case, the plurality of memory blocks BLK1 to BLKz include memory cells disposed in a three-dimensional arrangement.

The address decoder 120 is coupled to the plurality of memory blocks BLK1 to BLKz through the word lines WL. The address decoder 120 is configured to operate in response to control of the control logic 140.

An address ADDR received in a program operation by the control logic 140 includes a block address BADD and a row address RADD. The address decoder 120 receives the block address BADD and the row address RADD through the control logic 140.

The address decoder 120 is configured to decode the block address BADD received from the control logic 140 after the control logic receives the address ADDR. The address decoder 120 selects one memory block among the plurality of memory blocks BLK1 to BLKz according to the decoded block address BADD.

The address decoder 120 is configured to decode the row address RADD received from the control logic 140 after the control logic receives the address ADDR. The address decoder 120 is configured to select one of local word lines of the selected memory block according to the decoded row address. For example, the address decoder 120 applies a program voltage or read voltage received from the voltage generator 150 to the selected local word line, and applies a program pass voltage or read pass voltage received from the voltage generator 150 to unselected local word lines.

The voltage generator 150 operates in response to control of the control logic 140. The voltage generator 150 generates an internal power voltage by using a power voltage supplied from the outside (hereinafter referred to as an external power voltage). For example, the voltage generator 150 generates an internal power voltage by regulating the external power voltage. The generated internal power voltage may be used as an operating voltage of the address decoder 120, the read/write circuit 130, the control logic 140, the input/output buffer 160, and the temperature measuring unit 170. As an example, the voltage generator 150 generates a program voltage Vpgm and a pass voltage Vpass in a program operation. For another example, the voltage generator 150 generates a read voltage Vread and a read pass voltage in a read operation. In an example of an embodiment, the voltage generator 150 may include a plurality of pumping capacitors, and generate a plurality of voltages by selectively activating the plurality of pumping capacitors in response to control of the control logic 140.

The read/write circuit 130 is coupled to the memory cell array 110 through the bit lines BL1 to BLm. The read/write circuit 130 operates in response to control of the control logic 140.

The read/write circuit 130 is configured to receive a column address CADD received from the control logic 140 after the control logic receives the address ADDR and the read/write circuit then decodes the received column address CADD. Also, the read/write circuit 130 receives and transmits data DATA to and from the input/output buffer 160.

The read/write circuit 130 includes a plurality of page buffers PB1 to PBm. The read/write circuit 130 may operate as a "read circuit" in a read operation of the memory cell array 110 and operate as a "write circuit" in a write operation of the memory cell array 110. The plurality of page buffers PB1 to PBm are coupled to the memory cell array 110 through the bit lines BL1 to BLm. In order to sense threshold voltages of memory cells in a read operation and a program verify operation, the plurality of page buffers PB1 to PBm sense a change in amount of current flowing corresponding to a program state of a corresponding memory cell while continuously supplying sensing current to bit lines connected to the memory cells and latches the sensed change as sensing data. However, depending on a temperature of the semiconductor memory device 100, the amount of current corresponding to the program state of the memory cell may be changed in the read operation. Accordingly, the semiconductor memory device 100 according to the present disclosure can determine an activation time of a strobe signal applied to the page buffers PB1 to PBm in a read operation of the memory cell array 110, based on information on a temperature measured by the temperature measuring unit 170. The read/write circuit 130 operates in response to page buffer control signals PB CNTL output from the control logic 140. The page buffer control signals PB CNTL may include, for example but are not limited to, set voltages PB_SENSE+αV, page buffer sensing signals PB_SENSE, discharge signals SA_DISCH, sensing signals SA_SENSE, precharge signals SA_PRECH and strobe signals STB. Throughout this specification, a reading operation and a reading command are also referred to as a read operation and a read command.

In a read operation, the read/write circuit 130 arbitrarily stores read data by sensing data of memory cells and then outputs data DATA to the input/output buffer 160.

In a program operation, the read/write circuit 130 receives data DATA to be programmed through the input/output buffer 160. Also, the read/write circuit 130 transmits data DATA to bit lines BL1 to BLm corresponding to a decoded column address. The read/write circuit 130 applies a program permission voltage (e.g., a ground voltage) to a bit line coupled to a memory cell of which threshold voltage is to be increased among memory cells coupled to a selected local word line (hereinafter, referred to as selected memory cells), and applies a program prohibition voltage (e.g., an internal power voltage) to a bit line coupled to a memory cell of which threshold voltage is to be maintained among the selected memory cells. Accordingly, the data DATA is programmed to the selected memory cells.

In an embodiment, the read/write circuit 130 may include a column select circuit (not illustrated) and the like, in addition to the page buffers PB1 to PBm described above.

The control logic 140 receives a command CMD indicating, for example, a program operation through the input/output buffer 160. The control logic 140 is configured to control the address decoder 120, the voltage generator 150, the read/write circuit 130, and the input/output buffer 160 in response to the command CMD.

The control logic 140 receives an address ADDR through the input/output buffer 160. The control logic 140 transmits a block address BADD and a row address RADD in the received address ADDR to the address decoder 120, and transmits a column address CADD in the received address ADDR to the read/write circuit 130.

The input/output buffer 160 operates in response to control of the control logic 140. The input/output buffer 160 receives a command CMD, an address ADDR, and data DATA from the outside, transmits the command CMD and the address ADDR to the control logic 140, and transmits the data DATA to the read/write circuit 130. For example, the input/output buffer 160 may receive a command CMD, an address ADDR, and data DATA from a controller 1100 which will be described later with reference to FIG. 13 and transmit the command CMD and the address ADDR to the control logic 140, and transmits the data DATA to the read/write circuit 130.

The temperature measuring unit may measure a temperature of the semiconductor memory device 100 and transmit a temperature measurement result to the control logic 140. In an embodiment, for example, the temperature measuring unit 170 may be configured to measure a temperature of the semiconductor memory device 100 periodically with a predetermined measurement cycle. In another example, the temperature measuring unit 170 may be configured to measure a temperature of the semiconductor memory in response to a measurement control signal MCNTL from the control logic 140. In this case, the control logic 140 may send the measurement control signal MCNTL when a read command CMD is received by the control logic 140. The temperature measuring unit 170 may transmit the measured result to the control logic 140. In an example of an embodiment, the temperature measuring unit 170 may be configured as a temperature sensor mounted in a package of the semiconductor memory device 100. The control logic 140 may reflect the received temperature measurement result to the operation control of the semiconductor memory device 100. For example, the control logic 140 may control an activation time of a strobe signal applied to the page buffers PB1 to PBm in a read operation, based on the received temperature measurement result.

The strobe signal is a signal for latching a voltage of an internal node, which is determined through bit line sensing. The strobe signal and the latching of an internal voltage will be described later with reference to FIGS. 3 and 4. According to the present disclosure, the activation time of the strobe signal can be controlled according to the temperature of the semiconductor memory device 100.

In general, a temperature of a semiconductor memory device during a program operation is different from that of the semiconductor memory device during a read operation. In particular, the temperature of the semiconductor memory device during the program operation that accompanies the application of a high voltage is relatively higher than that of the semiconductor memory device during the read operation. The distribution of threshold voltages of the memory cells of the memory cell array may be varied depending on a change in temperature, and accordingly, the amount of current is varied depending on a program state of a corresponding memory cell in the read operation. Therefore, the reliability of the semiconductor memory device with respect to the read operation is lowered. Thus, the activation time of the strobe signal applied in the read operation is applied to rely on the temperature of the semiconductor memory device, thereby compensating for a variation in the distribution of threshold voltages.

Meanwhile, the control logic 140 of the semiconductor memory device 100 according to the present disclosure may apply different activation times of strobe signals according to positions of a word line on which the read operation is to be performed. Memory cells coupled to a word line adjacent to a drain select line and memory cells coupled to a word line adjacent to a source select line have different sensing current characteristics. That is, with respect to the word line adjacent to the source select line, as the position of a word line coupled to a memory block becomes closer to the drain select line, the current characteristics of memory cells coupled to the corresponding word line are varied. Therefore, when the activation time of a single strobe signal determined based on only the temperature of the semiconductor memory device is applied regardless of the position of a word line, it is difficult to perform an accurate read operation based on a distribution characteristic of threshold voltages. Accordingly, in the semiconductor memory device according to the present disclosure, different activation times of strobe signals are applied according to positions of a word line on which the read operation is to be performed, so that the reliability of the read operation can be further improved.

Figure 2:
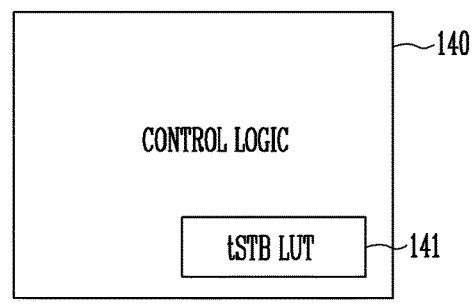
FIG. 2 is a block diagram illustrating a control logic of FIG. 1.

FIG. 2 is a block diagram illustrating the control logic of FIG. 1.

Referring to FIG. 2, the control logic 140 may include a lookup table (LUT) 141 for storing activation times tSTB of strobe signals. As described above, the control logic 140 of the semiconductor memory device 100 according to an embodiment of the present disclosure may apply different activation times tSTB of strobe signals according to positions of a word line on which the read operation is to be performed. To this end, the lookup table 141 may store an activation time of a strobe signal corresponding to each word line. The lookup table 141 may be implemented as a storage device such as a register formed in the control logic 140. Accordingly, when the semiconductor memory device 100 receives a read command and an address corresponding thereto from the outside, e.g., the controller, the control logic 140 can determine an activation time of a strobe signal to be applied in the read operation of a word line corresponding to the received address, with reference to the lookup table 141.

The activation time tSTB of a strobe signal corresponding to each word line, which is stored in the lookup table 141, may be determined based on a result measured by the temperature measuring unit 170. The control logic 140 may update, periodically or if necessary, the activation times tSTB of the strobe signals, which are stored in the lookup table 141. In this case, the updating may be performed based on the temperature measurement result received from the temperature measuring unit 170.

Figure 3:
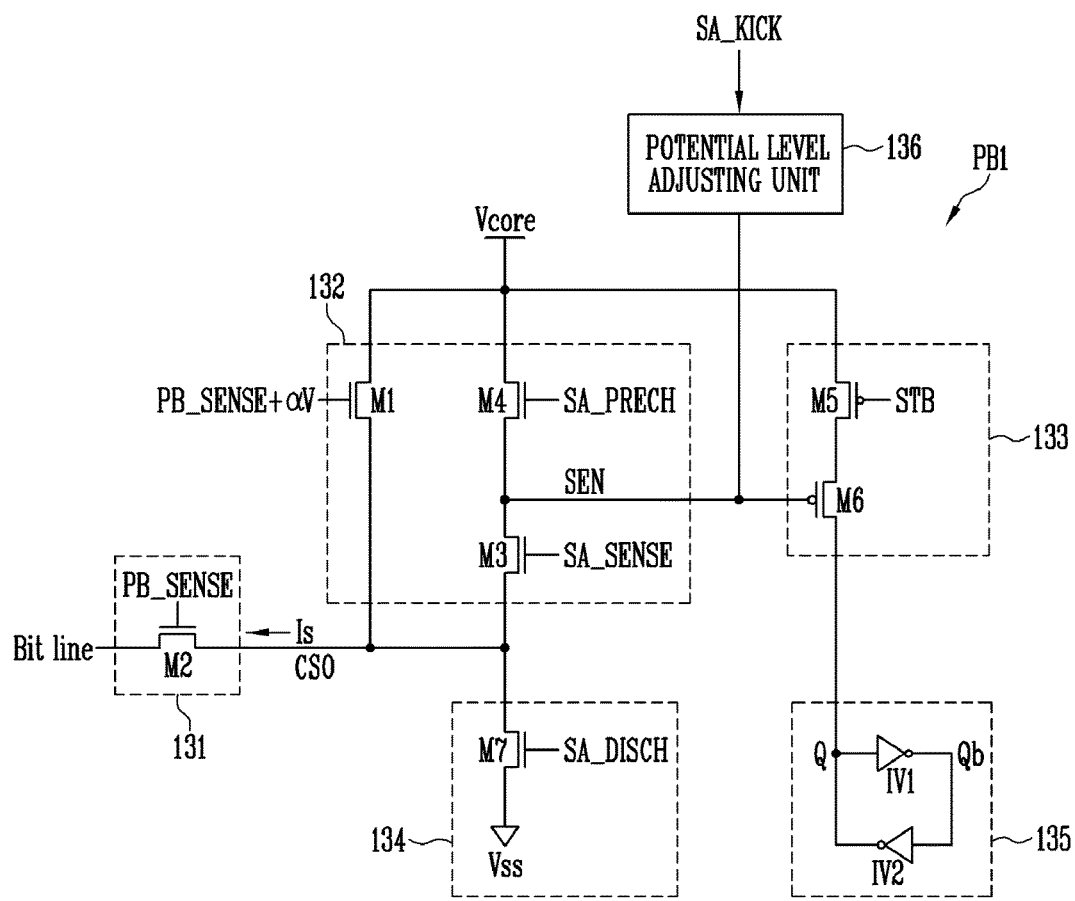
FIG. 3 is a circuit diagram illustrating a page buffer according to an example of an embodiment.

FIG. 3 is a circuit diagram illustrating a page buffer according to an example of an embodiment.

Referring to FIG. 3, the page buffer PB1 may include a bit line sensing circuit 131, a clamp circuit 132, a current determining circuit 133, an internal node discharge circuit 134, a latch circuit 135, and a potential level adjusting unit 136. However, the page buffer illustrated in FIG. 3 is illustrative, and page buffers having various structures may also be applied to the read/write circuit 130 of the semiconductor memory device 100 according to the present disclosure.

The bit line sensing circuit 131 is coupled between a bit line Bit line and an internal node CS0, and controls a potential of the internal node CS0 according to a potential of the bit line Bit line by allowing the bit line Bit line and the internal node CS0 to be electrically coupled to each other in response to a page buffer sensing signal PB_SENSE. Referring to FIG. 3, the bit line sensing circuit 131 includes a transistor M2. The page buffer sensing signal PB_SENSE may be applied to a gate electrode of the transistor M2.

The clamp circuit 132 is coupled between a power voltage terminal Vcore and the internal node CS0, and supplies a current to the internal node CS0 in response to a set voltage PB_SENSE+αV higher by a certain potential αV than the page buffer sensing signal PB_SENSE applied to the bit line sensing circuit 131, a precharge signal SA_PRECH, and a sensing signal SA_SENSE.

The clamp circuit 132 includes a plurality of transistors M1, M3, and M4. The transistor M1 is coupled between the power voltage terminal Vcore and the internal node CS0, and is turned on or turned off in response to the set voltage PB_SENSE+αV. The transistors M4 and M3 are coupled in series between the power voltage terminal Vcore and the internal node CS0. The transistor M4 is turned on or turned off in response to the precharge signal SA_PRECH, and the transistor M3 is turned on or turned off in response to the sensing signal SA_SENSE.

The current determining circuit 133 is coupled between the power voltage terminal Vcore and the latch circuit 135, and supplies the amount of current corresponding to a potential of a sensing node SEN between the transistor M3 and the transistor M4 in response to a strobe signal STB.

The current determining circuit 133 includes transistors M5 and M6 coupled in series between the power voltage terminal Vcore and the latch circuit 135. The transistor M5 is turned on or turned off in response to the strobe signal STB. The transistor M6 controls the amount of current supplied from the power voltage terminal Vcore according to the potential of the sensing node SEN and supplies the current to the latch circuit 135.

The internal node discharge circuit 134 is coupled between the internal node CS0 and a ground power source Vss, and discharges the internal node CS0 to a low level in response to a discharge signal SA_DISCH. The internal node discharge circuit 134 includes a transistor M7 coupled between the internal node CS0 and the ground power source Vss, and the transistor M7 is turned on or turned off in response to the discharge signal SA_DISCH.

The latch circuit 135 is coupled to the current determining circuit 133, and stores data according to the amount of current supplied from the current determining circuit 133. The latch circuit 135 includes inverters IV1 and IV2 coupled in reverse parallel between a first node Q and a second node Qb.

The potential level adjusting unit 136 is coupled to the sensing node SEN, and adjusts a precharge potential level of the sensing node SEN in response to a kick signal SA_KICK. For example, when the potential level of the kick signal SA_KICK is high, the precharge potential level of the sensing node SEN increases. When the potential level of the kick signal SA_KICK is low, the precharge potential level of the sensing node SEN decreases.

Although not illustrated in FIG. 3, the potential level adjusting unit 136 may be configured as a capacitor coupled to the sensing node SEN. A first electrode of the capacitor may be coupled to the sensing node SEN, and the kick signal SA_KICK may be applied through a second electrode of the capacitor. When the potential level of the kick signal SA_KICK is high, the precharge potential level of the sensing node SEN may increase due to a boosting phenomenon. When the potential level of the kick signal SA_KICK is low, the precharge potential level of the sensing node SEN may decrease.

Figure 4:
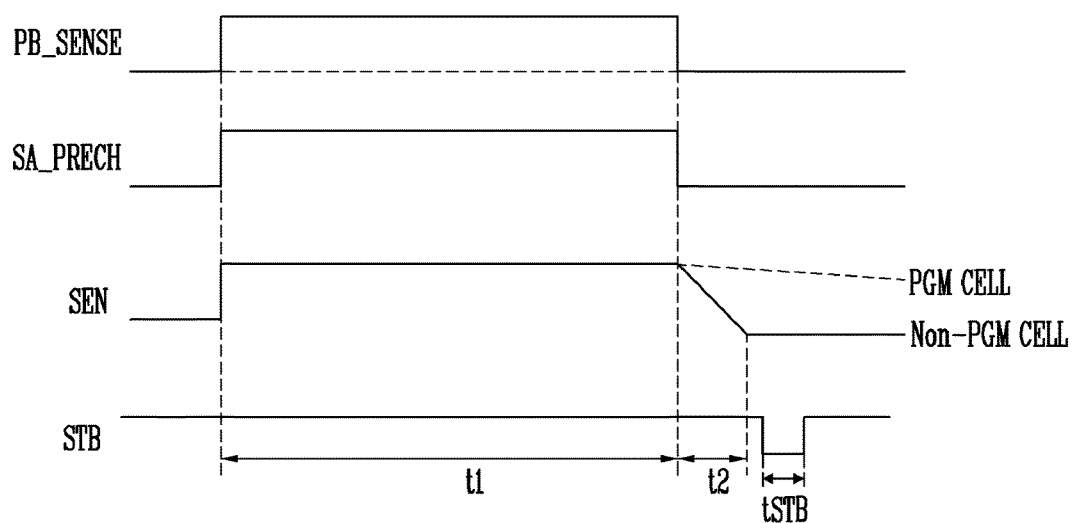
FIG. 4 is a timing diagram illustrating an operation of the page buffer according to an example of an embodiment.

FIG. 4 is a timing diagram illustrating an operation of the page buffer according to an example of an embodiment.

Referring to FIG. 4, there is illustrated a timing diagram of signals input to the page buffer of the semiconductor memory device according to the present disclosure in a read operation of the memory cell array.

In FIG. 4, the page buffer sensing signal PB_SENSE and the precharge signal SA_PRECH may be changed from a low value to a high value during a period t1. For example, the page buffer sensing signal PB_SENSE may be changed from an initialization voltage VPBS0 to a first page buffer sensing voltage VPBS1. Here, the initialization voltage VPBS0 may be a ground voltage or a voltage of 0V. That is, the initialization voltage VPBS0 is a voltage at which the transistor M2 is turned on.

As the page buffer sensing signal PB_SENSE and the precharge signal SA_PRECH are changed from the low value to the high value, the voltage of the sensing node SEN also increases. Meanwhile, the strobe signal STB may maintain a high value during the period t1.

At a point of time when the period t1 is changed to a period t2, the precharge signal SA_PRECH may be changed from the high value to the low value. At the point of time when the precharge signal SA_PRECH is changed from the high value to the low value, the voltage value of the page buffer sensing signal PB_SENSE may be changed. For example, the page buffer sensing signal PB_SENSE may be changed from the first page buffer sensing voltage VPBS1 to a second page buffer sensing voltage VPBS2. As the voltage value of the page buffer sensing signal PB_SENSE is changed from the first page buffer sensing voltage VPBS1 to the second page buffer sensing voltage VPBS2, the gate-source voltage Vgs of the transistor M2 illustrated in FIG. 3 may decrease. Accordingly, the sensing current Is flowing through the transistor M2 decreases. The second page buffer sensing voltage VPBS2 is a voltage value lower than that of the first page buffer sensing voltage VPBS1, but is a voltage value higher than the threshold voltage of the transistor M2. Thus, although the voltage value of the page buffer sensing signal PB_SENSE is changed to the second page buffer sensing voltage VPBS2, a current still flows between the source and drain of the transistor M2. However, as the voltage value of the page buffer sensing signal PB_SENSE is changed from the first page buffer sensing voltage VPBS1 to the second page buffer sensing voltage VPBS2, the current between the source and drain of the transistor M2 is also changed. For example, as the voltage of the page buffer sensing signal PB_SENSE is lowered to the second page buffer sensing voltage VPBS2, the current between the source and drain of the transistor M2 also decreases.

In the period t2, the voltage value of the sensing node SEN is differently changed depending on the program state of a cell coupled to a bit line. As illustrated in FIG. 4, when the cell coupled to the bit line is an erased cell Non-PGM CELL, the voltage of the sensing node SEN rapidly drops. As illustrated in FIG. 4, when the cell coupled to the bit line is a programmed cell PGM CELL, the voltage of the sensing node SEN gently drops.

Hereinafter, an operation of the semiconductor memory device when a read command is input will be described for each step.

1) Read Command Input

If a read command is input from the outside of the semiconductor memory device, a command CMD and a control signal CNTL are input to the control logic 140 in response to the read command. Accordingly, the control logic 140 outputs signals for controlling the address decoder 120, the read/write circuit 130, and the voltage generator 150 to perform a read operation.

2) Internal Node Precharge

Each of the plurality of page buffers PB1 to PBm precharges an internal node CS0, respectively, to a certain potential level. As the page buffer sensing signal SA_SENSE and the precharge signal SA_PRECH are applied as the high level, the transistor M3 and the transistor M4 are turned on. As a result, the internal node CS0 is precharged to the level of a power voltage Vcore.

3) Data Sensing

A read voltage Vread generated by the voltage generator 150 is applied to a selected word line of a selected memory block among the plurality of memory blocks BLK1 to BLKz. A pass voltage Vpass is applied to the other unselected word lines.

Each of the plurality of page buffers PB1 to PBm performs a data sensing operation. The data sensing operation is as follows.

As the page buffer sensing signal PB_SENSE is applied as the high level, the bit line Bit line and the internal node CS0 are electrically coupled to each other.

As the precharge signal SA_PRECH is changed from the high level to a low level after a certain time, the power voltage Vcore applied to the internal node CS0 is cut off. At this time, when the threshold voltage of a memory cell coupled to the selected word line is lower than the read voltage, the memory cell is turned on, so that the potential of the internal node CS0 is discharged to the low level due to a discharge current path through the bit line Bit line.

Therefore, the internal node CS0 and the sensing node SEN are discharged to the low level, and the transistor M6 is turned on by the sensing node SEN having the low level.

After that, if the transistor M5 is turned on as the strobe signal STB is applied as the low level during a certain time tSTB, the power voltage Vcore is supplied to the first node Q of the latch circuit 135, so that the first node Q becomes the high level. Therefore, data corresponding to an erased cell is latched to the latch circuit 135.

On the other hand, when the threshold voltage of the memory cell coupled to the selected word line is higher than the read voltage Vread, the memory cell is turned off, so that the potential of the internal node CS0 maintains a precharge level.

Therefore, the internal node CS0 and the sensing node SEN maintain the precharge level. After that, although the transistor M5 is turned on as the strobe signal STB is applied as the low level during a certain time, the transistor M6 is turned off by the sensing node SEN having the precharge level. Thus, the first node Q of the latch circuit 135 maintains the low level that is an initialization state, so that data corresponding to a programmed cell is latched to the latch circuit 135.

As described above, according to the present disclosure, the activation time tSTB of the strobe signal STB can be controlled according to a temperature of the semiconductor memory device 100. In general, a temperature of a semiconductor memory device during a program operation is different from that of the semiconductor memory device during a read operation, and accordingly, a variation in distribution of threshold voltages occurs due to a change in temperature. Thus, the activation time of the strobe signal applied in the read operation is applied to rely on the temperature of the semiconductor memory device, thereby compensating for a variation in the distribution of threshold voltages.

Meanwhile, the semiconductor memory device 100 according to the present disclosure may apply different activation times of strobe signals according to positions of a word line on which the read operation is to be performed. When the activation time of a single strobe signal determined based on only the temperature of the semiconductor memory device is applied regardless of the position of a word line, it is difficult to perform an accurate read operation based on a distribution characteristic of threshold voltages. Accordingly, in the semiconductor memory device according to the present disclosure, different activation times of strobe signals are applied according to positions of a word line on which the read operation is to be performed, so that the reliability of the read operation can be further improved.

4) Data Output

Each of the plurality of page buffers PB1 to PBm output data DATA sensed through the data sensing operation to the input/output buffer 160.

As described above, according to the semiconductor memory device 100 according to an embodiment of the present disclosure, the control logic 140 applies different activation times tSTB of strobe signals STB according to positions of a word line in the read operation, so that the reliability of the semiconductor memory device 100 can be improved. However, when different activation times tSTB are individually applied to the respective word lines, the storage capacity of the lookup table 141 is increased, and the speed of the read operation is decreased. According to an example of an embodiment of the present disclosure, word lines coupled to a memory block may be divided into a plurality of groups, and different activation times of strobe signals may be applied to the respective groups. A method of grouping word lines and applying different activation times of strobe signals to the respective groups will be described later with reference to FIGS. 5 to 10.

Figure 5:
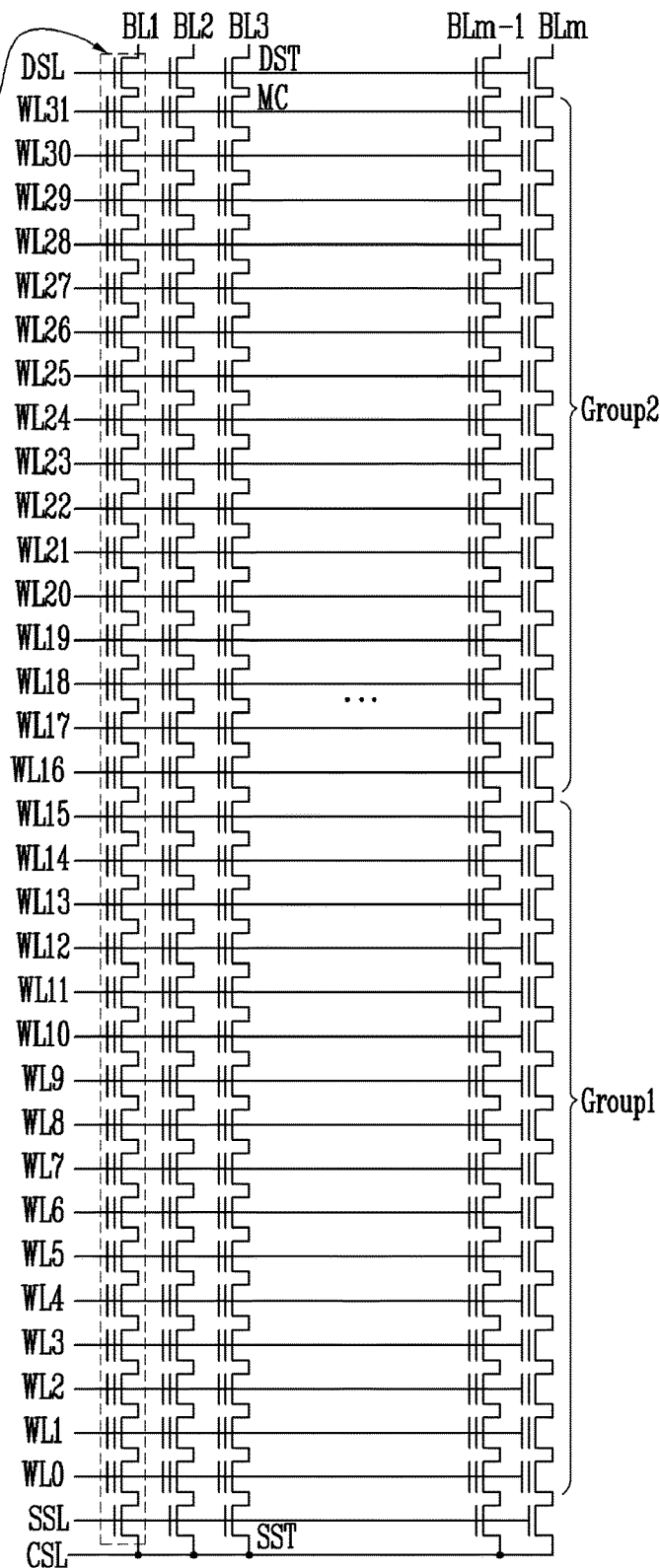
FIG. 5 is a diagram illustrating a method of grouping a plurality of word lines and applying different strobe signals according to an embodiment of the present disclosure.
Figure 6:
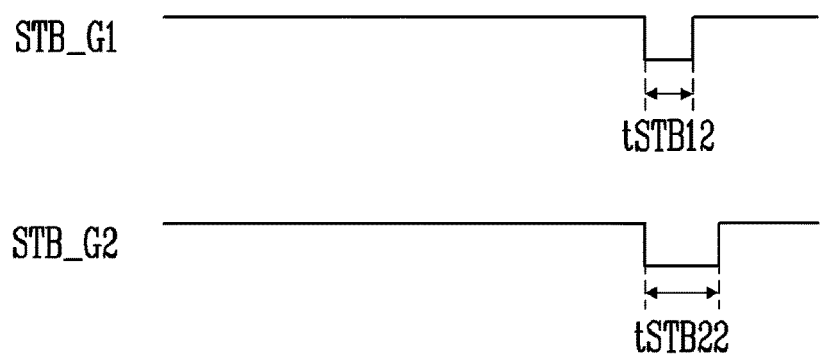
FIG. 6 is a diagram illustrating a strobe signal applied to each group of the plurality of word lines, based on the grouped result of FIG. 5.

FIG. 5 is a diagram illustrating a method of grouping a plurality of word lines and applying different strobe signals according to an embodiment of the present disclosure. Meanwhile, FIG. 6 is a diagram illustrating a strobe signal applied to each group of a plurality of word lines, based on the grouped result of FIG. 5. Hereinafter, a method of performing a read operation by grouping word lines and applying different strobe signals to the respective groups will be described.

Referring to FIG. 5, the control logic 140 of the semiconductor memory device 100 according to an embodiment of the present disclosure may group word lines coupled to a memory block. For example, in FIG. 5, the memory block is coupled to 32 word lines WL0 to WL31. The memory block is coupled to a drain select line DSL and source select line SSL. Among the 32 word lines WL0 to WL31, a word line WL0 is located adjacent to the source select line SSL, and a word line WL31 is located adjacent to the drain select line DSL. Referring to FIG. 5, the memory block includes m memory strings respectively coupled to bit lines BL1 to BLm. Each of the memory strings includes memory cells MC coupled to the word lines WL0 to WL31. Each of the memory strings includes a drain select transistor DST coupled to the drain select line DSL and a source select transistor SST coupled to the source select line SSL. The drain select transistor is located adjacent to a corresponding bit line. The source select transistor is located adjacent to a common source line CSL. Referring to FIG. 5, the 32 word lines may be grouped into two word line groups. Although not illustrated, in an embodiment, for example, there may be a pipe transistor PT coupled between a pair of adjacent memory cells, a gate of the pipe transistor PT coupled to a pipe line PL. Each of a first word line group Group1 and a second word line group Group2 includes 16 word lines.

Referring to FIG. 6, a strobe signal applied to each group at a specific temperature, for example, is illustrated. Different from FIG. 4, in FIG. 6, a timing diagram illustrating potential changes of the page buffer sensing signal PB_SENSE, the precharge signal SA_PRECH, and the sensing node SEN are omitted.

Based on the grouped result, the control logic 140 may determine an activation time of a strobe signal to be applied in a read operation according to the position of a word line coupled to a memory cell to be programmed. Accordingly, the lookup table 141 included in the control logic 140 may store data, for example, illustrated in the following Table 1.

TABLE 1

| Temperature range | Group1 (WL0~WL15) | Group2 (WL16~WL31) |
|---|---|---|
| Temp1 to Temp2 | tSTB11 | tSTB21 |
| Temp2 to Temp3 | tSTB12 | tSTB22 |
| Temp3 to Temp4 | tSTB13 | tSTB23 |
| Temp4 to Temp5 | tSTB14 | tSTB24 |

In Table 1, the temperatures Temp1, Temp2, Temp3, Temp4, and Temp5 exhibited in the temperature range may have a relationship as shown in Relational Expression 1.

$$\text{Temp1}<\text{Temp2}<\text{Temp3}<\text{Temp4}<\text{Temp5} \quad \text{Relational Expression 1}$$

The control logic 140 determines the activation time of the strobe signal to be applied in the read operation with reference to the lookup table 141. For example, when it is determined that, as a measurement result of the temperature measuring unit 170, the current temperature of the semiconductor memory device 100 is located within a temperature range Temp2 to Temp3, the control logic 140 may determine, as tSTB12 and tSTB22, activation times of strobe signals applied to the word lines belonging to the respective groups Group1 and Group2.

That is, in FIG. 5, when a read command on a word line WL8 belonging to the first group Group1 is received, the control logic 140 may receive a current temperature measurement result of the semiconductor memory device 100 from the temperature measuring unit 170. As an example, when it is determined that, as the received result, the current temperature of the semiconductor memory device 100 is located within the temperature range Temp2 to Temp3, the control logic 140 may determine, as tSTB12, an activation time of a strobe signal STB_G1 to be applied in a read operation corresponding to the corresponding read command. Accordingly, the strobe signal STB_G1 shown in FIG. 6 may be input to the page buffer in the read operation (i.e., STB of FIG. 3). As another example, when it is determined that the current temperature of the semiconductor memory device 100 is located within a temperature range Temp4 to Temp5, the control logic 140 may determine, as tSTB14 (for a word line in the first group Group1), the activation time of the strobe signal STB_G1 to be applied in the read operation, with reference to the lookup table 141.

In addition, when a read command on a word line WL22 belonging to the second group Group2 is received, the control logic 140 may receive a current temperature measurement result of the semiconductor memory device 100 from the temperature measuring unit 170. As an example, when it is determined that, as the received result, the current temperature of the semiconductor memory device 100 is located within the temperature range Temp2 to Temp3, the control logic 140 may determine, as tSTB22, an activation time of a strobe signal STB_G2 to be applied in a read operation corresponding to the corresponding read command. Accordingly, the strobe signal STB_G2 shown in FIG. 6 may be input to the page buffer in the read operation (i.e., STB of FIG. 3). As another example, when it is determined that the current temperature of the semiconductor memory device 100 is located within the temperature range Temp4 to Temp5, the control logic 140 may determine, as tSTB24 (for a word line in the second group Group2), the activation time of the strobe signal STB_G2 to be applied in the read operation, with reference to the lookup table 141.

With respect to the same word line group, an activation time of a strobe signal may be differently determined according to temperature. For example, as the temperature of the semiconductor memory device 100 becomes higher, the activation time of the strobe signal may be decreased to compensate for a change in sensing current in a read operation. In this case, the activation times of the strobe signals applied to the first group Group1 may have a relationship as shown in the following Relational Expression 2.

$$tSTB11 > tSTB12 > tSTB13 > tSTB14 \quad \text{Relational Expression 2}$$

Similarly, the activation times of the strobe signals applied to the second group Group2 may also have a relationship as shown in the following Relational Expression 3.

$$tSTB21 > tSTB22 > tSTB23 > tSTB24 \quad \text{Relational Expression 3}$$

The upper and lower limits of the temperature ranges shown in Table 1 and the number of temperature ranges may be variously determined, if necessary. In Table 1, the activation times of the strobe signals are defined, for example, by dividing the temperature sections Temp1 to Temp5 into four temperature ranges, but the number of temperature ranges may be greater or smaller than the four. As a larger number of temperature ranges is defined, the activation time of a strobe signal according to a change in temperature is more minutely controlled, and thus the reliability of the semiconductor memory device 100 in a read operation is improved. However, in this case, the lookup table 141 having a larger capacity is required. When a smaller number of temperature ranges is defined, the lookup table 141 having a smaller capacity may be used. However, in this case, it may be difficult to minutely control the activation time of a strobe signal according to a change in temperature.

Meanwhile, the upper limit temperature Temp5 and the lower limit temperature Temp1 of the temperature sections Temp1 to Temp5 shown in Table 1 may be experimentally predetermined. For example, the temperature Temp1 may be determined as the lowest temperature in an environment considered that the semiconductor memory device 100 will be used. Meanwhile, the temperature Temp5 may be determined as not only the highest temperature in the environment considered that the semiconductor memory device 100 will be used but also a temperature obtained by considering heat generated due to an operation of the semiconductor memory device 100.

As described above, the control logic 140 of the semiconductor memory device 100 according to the present disclosure may apply different activation times of strobe signals according to positions of a word line on which the read operation is to be performed. Memory cells coupled to a word line adjacent to a drain select line and memory cells coupled to a word line adjacent to a source select line have different sensing current characteristics. That is, with respect to the word line adjacent to the source select line, as the position of a word line coupled to a memory block becomes closer to the drain select line, the current characteristics of memory cells coupled to the corresponding word line are varied. Therefore, when the activation time of a single strobe signal determined based on only the temperature of the semiconductor memory device is applied regardless of the position of a word line, it is difficult to perform an accurate read operation based on a distribution characteristic of threshold voltages. Accordingly, in the semiconductor memory device according to the present disclosure, different activation times of strobe signals are applied according to positions of a word line on which the read operation is to be performed, so that the reliability of the read operation can be further improved. Referring to Table 1 and FIG. 6, an embodiment in which the activation time tSTB12 is shorter than the activation time tSTB22 is illustrated in FIG. 6, but the present disclosure is not limited thereto. The activation times tSTB12 and tSTB22 of the strobe signals according to the positions of the respective groups may be determined based on characteristics of the memory cell, characteristics of the word lines, influence of temperature on each word line and the memory cell, and the like. For example, in another embodiment, the activation time tSTB12 may be longer than the activation time tSTB22.

An embodiment in which the word lines are grouped into the two word line groups Group1 and Group2 is illustrated in FIG. 5. However, the word lines of the semiconductor memory device according to the present disclosure may be grouped into three or more word line groups. For example, there may be an embodiment in which the word lines are grouped into four word line groups and this will be described with reference to FIG. 7.

Figure 7:
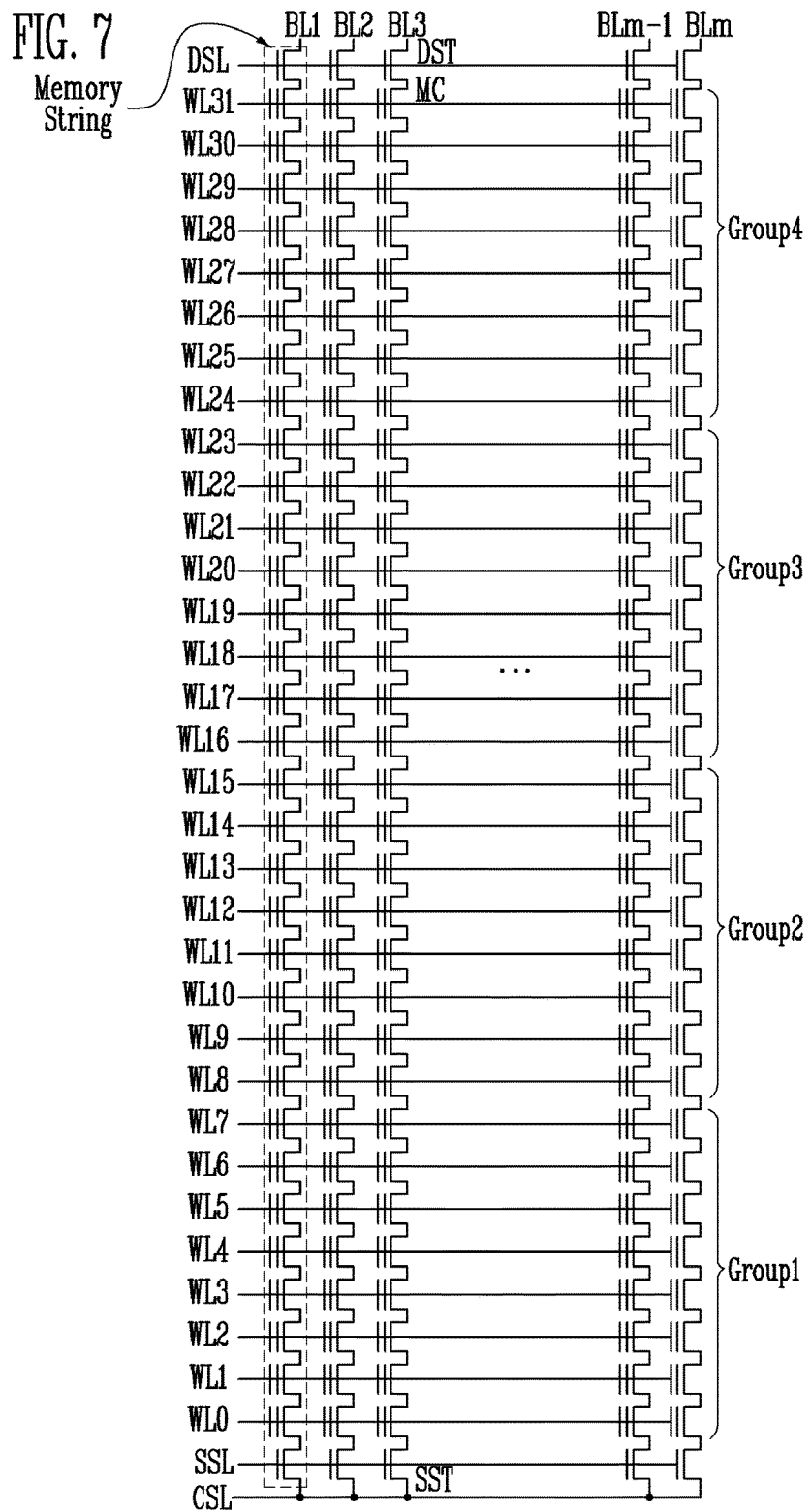
FIG. 7 is a diagram illustrating a method of grouping a plurality of word lines and applying different strobe signals according to an embodiment of the present disclosure.
Figure 8:
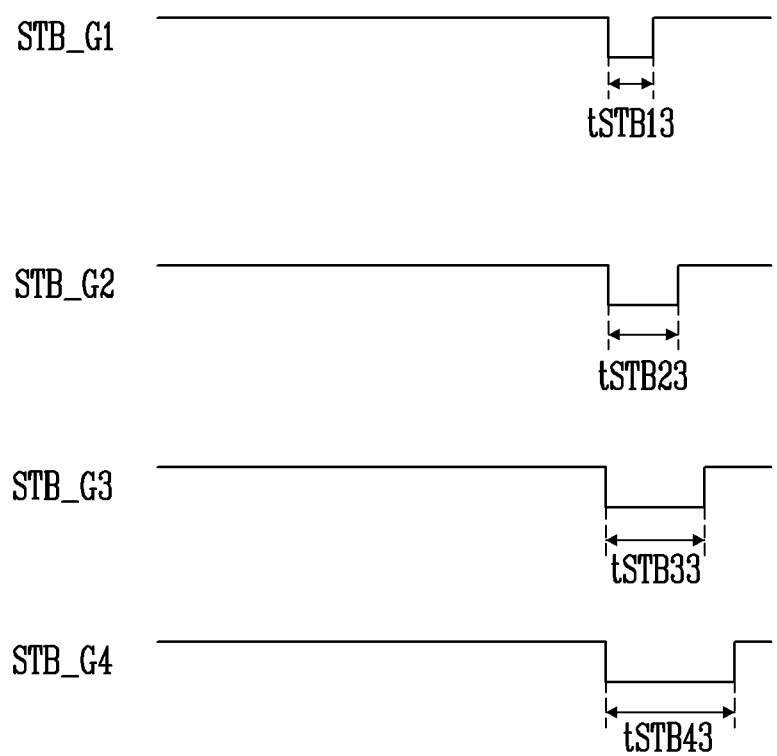
FIG. 8 is a diagram illustrating a strobe signal applied to each group of the plurality of word lines, based on the grouped result of FIG. 7.

FIG. 7 is a diagram illustrating a method of grouping a plurality of word lines and applying different strobe signals according to another embodiment of the present disclosure. FIG. 8 is a diagram illustrating a strobe signal applied to each group of the plurality of word lines, based on the grouped result of FIG. 7. Hereinafter, a method of performing a read operation by grouping word lines into groups and applying different strobe signals to the respective groups will be described with reference to FIGS. 7 and 8.

Referring to FIG. 7, 32 word lines may be grouped into four word line groups. Each of first to fourth word line groups Group1 to Group4 includes 8 word lines.

Referring to FIG. 8, a strobe signal applied to each group at a specific temperature is illustrated, for example. Like FIG. 6, in FIG. 8, a timing diagram illustrating potential changes of the page buffer sensing signal PB_SENSE, the precharge signal SA_PRECH, and the sensing node SEN are omitted.

Based on the grouped result, the control logic 140 may determine an activation time of a strobe signal to be applied in a read operation according to the position of a word line coupled to a memory cell to be programmed. Accordingly, the lookup table 141 included in the control logic 140 may store data shown in the following Table 2.

TABLE 2

| Temperature range | Group1 (WL0~WL7) | Group2 (WL8~WL15) | Group3 (WL16~WL23) | Group4 (WL24~WL31) |
|---|---|---|---|---|
| Temp1 to Temp2 | tSTB11 | tSTB21 | tSTB31 | tSTB41 |
| Temp2 to Temp3 | tSTB12 | tSTB22 | tSTB32 | tSTB42 |
| Temp3 to Temp4 | tSTB13 | tSTB23 | tSTB33 | tSTB43 |
| Temp4 to Temp5 | tSTB14 | tSTB24 | tSTB34 | tSTB44 |

In Table 2, the temperatures Temp1, Temp2, Temp3, Temp4, and Temp5 exhibited in the temperature range may have a relationship as shown in the above-described Relational Expression 1. The control logic 140 determines the activation time of the strobe signal to be applied in the read operation with reference to the lookup table 141. For example, when it is determined that, as a measurement result of the temperature measuring unit 170, the current temperature of the semiconductor memory device 100 is located within a temperature range Temp3 to Temp4, the control logic 140 may determine, as tSTB13, tSTB23, tSTB33, and tSTB43, activation times of strobe signals applied to the word lines belonging to the respective groups Group1, Group1, Group3, and Group4.

Referring to FIG. 7, when a read command on a word line WL3 belonging to the first group Group1 is received, the control logic 140 may receive a current temperature measurement result of the semiconductor memory device 100 from the temperature measuring unit 170. As an example, when it is determined that, as the received result, the current temperature of the semiconductor memory device 100 is located within the temperature range Temp3 to Temp4, the control logic 140 may determine, as tSTB13, an activation time of a strobe signal STB_G1 to be applied in a read operation corresponding to the corresponding read command. Accordingly, the strobe signal STB_G1 shown in FIG. 8 may be input to the page buffer in the read operation (i.e., STB of FIG. 3). As another example, when it is determined that the current temperature of the semiconductor memory device 100 is located within a temperature range Temp1 to Temp2, the control logic 140 may determine, as tSTB11 (for a word line in the first group Group1), the activation time of the strobe signal STB_G1 to be applied in the read operation, with reference to the lookup table 141.

When a read command on a word line WL21 belonging to the third group Group3 is received, the control logic 140 may receive a current temperature measurement result of the semiconductor memory device 100 from the temperature measuring unit 170. As an example, when it is determined that, as the received result, the current temperature of the semiconductor memory device 100 is located within the temperature range Temp3 to Temp4, the control logic 140 may determine, as tSTB33, an activation time of a strobe signal STB_G3 to be applied in a read operation corresponding to the corresponding read command. Accordingly, the strobe signal STB_G3 shown in FIG. 8 may be input to the page buffer in the read operation (i.e., STB of FIG. 3). As described above, the control logic 140 refers to the lookup table 141, based on the current temperature of the semiconductor memory device 100, and determines an activation time of a corresponding strobe signal.

An embodiment in which the activation times tSTB11 to tSTB14, tSTB21 to tSTB24, tSTB31 to tSTB34, and tSTB41 to tSTB44 sequentially become longer as the position of a word line becomes closer to a bit line BL1 to BLm is illustrated in FIGS. 7 and 8, but the present disclosure is not limited thereto. As described above, the activation times tSTB11 to tSTB14, tSTB21 to tSTB24, tSTB31 to tSTB34, and tSTB41 to tSTB44 of the strobe signals according to the positions of the respective groups may be determined based on characteristics of the memory cell, characteristics of the word lines, influence of temperature on each word line and the memory cell, and the like. For example, in another embodiment, the activation times tSTB11 to tSTB14, tSTB21 to tSTB24, tSTB31 to tSTB34, and tSTB41 to tSTB44 may sequentially become shorter as the position of a word line becomes closer to a bit line BL1 to BLm.

An embodiment in which each of the word line groups Group1 to Group4 includes the same number of word lines is illustrated in FIG. 7. However, the word line groups of the semiconductor memory device according to the present disclosure may include different numbers of word lines.

As described with reference to FIGS. 5 to 8, an embodiment in which the word lines WL0 to WL31 coupled to the memory block are grouped into two or four word line groups is illustrated. However, the semiconductor memory device and the operation method thereof according to the present disclosure are not limited thereto, and various numbers of word line groups may be determined, if necessary. For example, if necessary, the number of word line groups may be determined equal to that of word lines coupled to the memory block. In this case, different activation times tSTB of strobe signals may be applied to the respective word lines. In this case, activation times of strobe signals are to be defined as many as the number of word lines for every temperature section. Thus, the activation time of a strobe signal according to the position of a word line can be minutely controlled, but the lookup table 141 having a larger capacity is required. For example, as shown in Table 1 and Table 2, 32 activation times of strobe signals are to be determined based on the four temperature ranges.

That is, the number of word line groups may be determined as a minimum of 2 to the maximum number of word lines. The number of word line groups may be determined within the above-described temperature ranges, if necessary.

Figure 9:
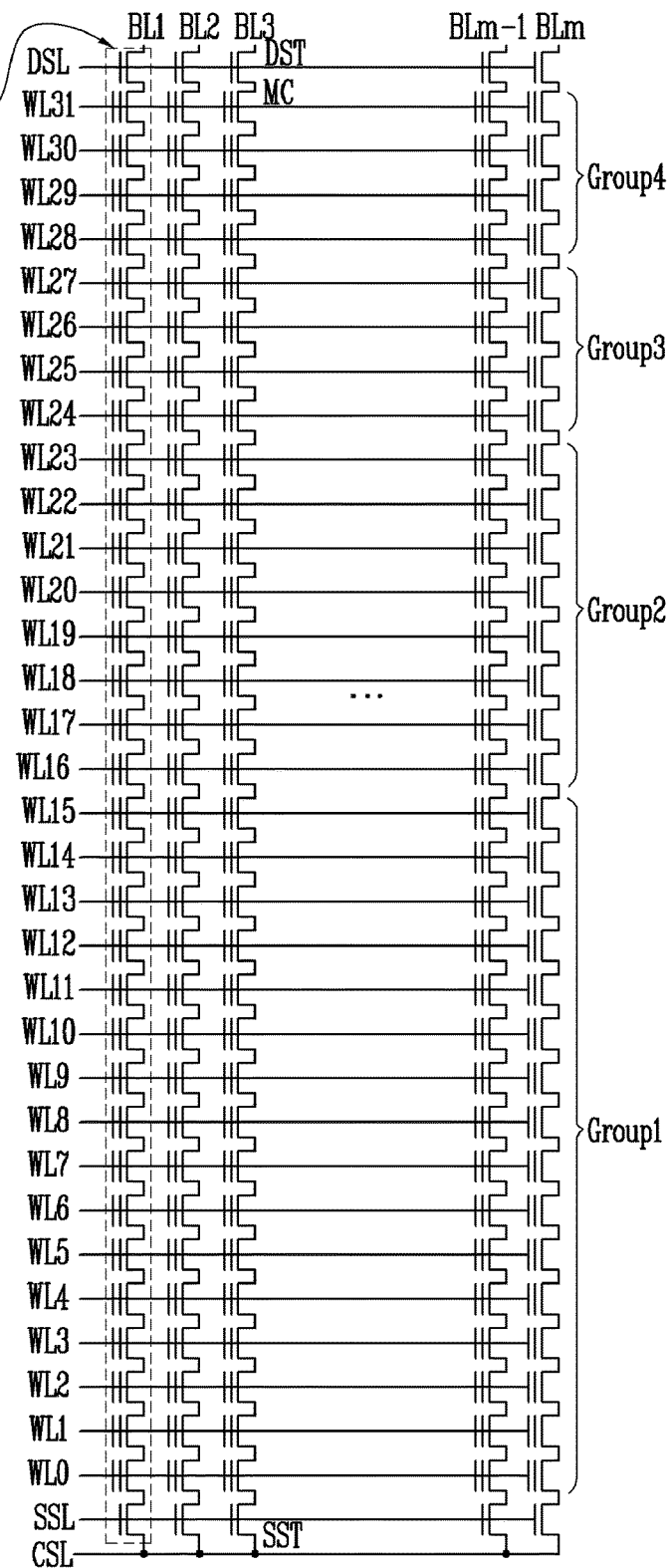
FIG. 9 is a diagram illustrating a method of grouping a plurality of word lines and applying different strobe signals according to an embodiment of the present disclosure.

FIG. 9 is a diagram illustrating a method of grouping a plurality of word lines and applying different strobe signals according to still another embodiment of the present disclosure. An embodiment in which each word line group includes word lines of which number is the same as that of the word line groups is illustrated in FIGS. 5 and 7. However, according to the semiconductor memory and the operation method thereof according to the present disclosure, the word line groups may include different numbers of word lines.

For example, when sensing current characteristics from the word line WL0 adjacent to the source select line to the word line WL31 adjacent to the drain select line are linearly changed, it may be advantageous in terms of operating characteristics that the activation times of the strobe signals are defined as each word line group includes the same number of word lines as shown in FIG. 7. However, in another example, the sensing current characteristics are not linearly changed, and may be rapidly changed as becoming closer to the word line WL31 adjacent to the drain select line DSL. In this case, as shown in FIG. 9, a word line group may include a smaller number of word lines as the word line group becomes closer to the drain select transistor DST. Accordingly, the same activation time of strobe signals is applied to a relatively larger number of word lines in a word line group Group1 having a small characteristic change, so that the storage capacity of the lookup table 141 can be reduced. Activation times of strobe signals are minutely applied to a relatively small number of word lines in word line groups Group3 and Group4 having a large characteristic change, so that the reliability of the semiconductor memory device in the read operation can be improved.

In this case, the lookup table 141 included in the control logic 140 may store data as shown in the following Table 3.

TABLE 3

| Temperature range | Group1 (WL0~WL15) | Group2 (WL16~WL23) | Group3 (WL24~WL27) | Group4 (WL28~WL31) |
|---|---|---|---|---|
| Temp1 to Temp2 | tSTB11 | tSTB21 | tSTB31 | tSTB41 |
| Temp2 to Temp3 | tSTB12 | tSTB22 | tSTB32 | tSTB42 |
| Temp3 to Temp4 | tSTB13 | tSTB23 | tSTB33 | tSTB43 |
| Temp4 to Temp5 | tSTB14 | tSTB24 | tSTB34 | tSTB44 |

As described above, the word line groups for performing an operation of the semiconductor memory device 100 according to the present disclosure may include different numbers of word lines.

Figure 10:
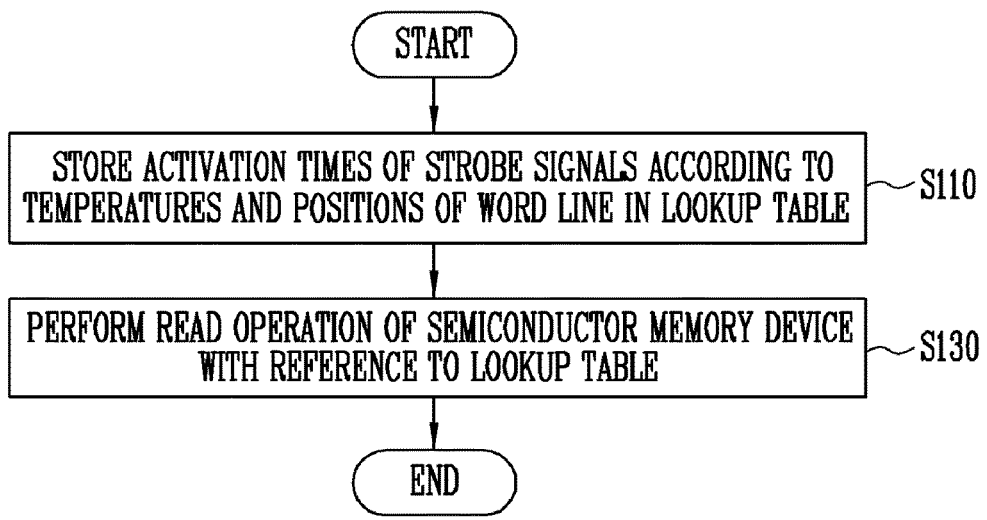
FIG. 10 is a flowchart illustrating an operation method of the semiconductor memory device according to an embodiment of the present disclosure.

FIG. 10 is a flowchart illustrating an operation method of the semiconductor memory device according to an embodiment of the present disclosure.

Referring to FIG. 10, first, activation times of strobe signals according to temperatures and positions of a word line and or memory cells are stored in the lookup table 141 (S110). The step (S110) may be performed in an initial test step according to a production process of the semiconductor memory device 100. Appropriate activation times of strobe signals according to temperature ranges may be determined through a test process. After that, in a process of actually operating the semiconductor memory device 100, a read operation of the semiconductor memory device 100 is performed with reference to the lookup table 141 (S130). In the step (S130), the read operation of the semiconductor memory device 100 is performed with reference to data of the lookup table 141. At this time, the read operation is performed by applying the activation times of the strobe signals, stored in the lookup table 141. The step (S130) may be performed whenever the semiconductor memory device 100 receives a read command. On the other hand, the step (S110) is not performed in an actual read operation, and may be performed in the initial test step or in driving of firmware of the semiconductor memory device 100. Configurations of the steps (S110 and S130) shown in FIG. 10 will be described later with reference to FIGS. 11 and 12.

Figure 11:
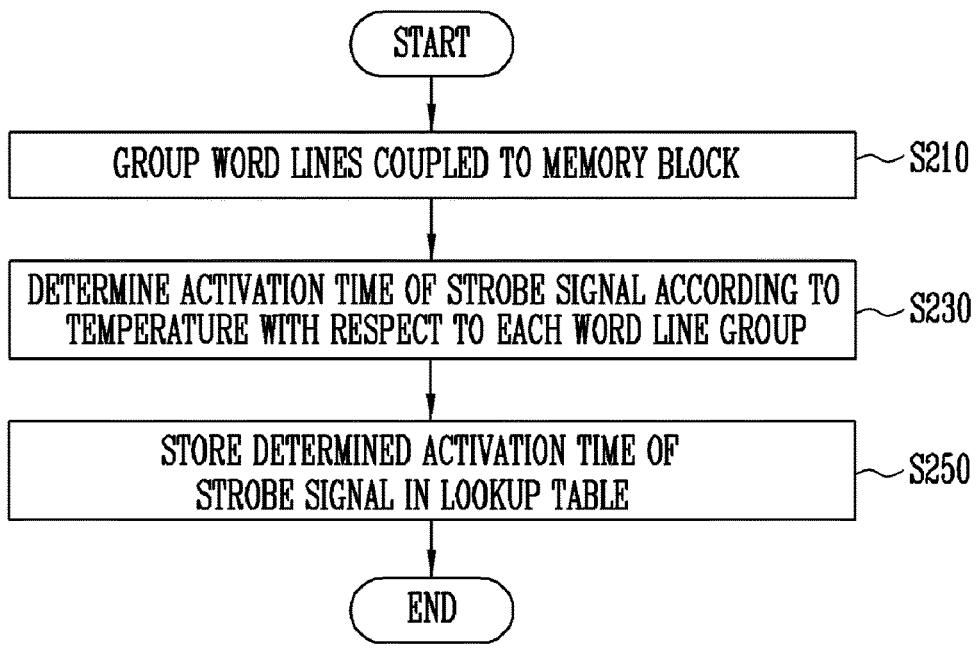
FIG. 11 is a flowchart illustrating a step of storing activation times of strobe signals of FIG. 10 in a lookup table.

FIG. 11 is a flowchart illustrating the step of storing activation times of strobe signals of FIG. 10 in the lookup table. As described above, steps of FIG. 11 may be performed in an initial test step of the semiconductor memory device 100 or in an initial driving step of the semiconductor memory device 100. Referring to FIG. 11, the step (S110) of storing the activation times of the strobe signals according to the temperatures and the positions of the word line and or memory cell may include a step (S210) of grouping word lines coupled to a memory block, a step (S230) of determining an activation time of a strobe signal according to a temperature with respect to each word line group, and a step (S250) of storing the determined activation time of the strobe signal in the lookup table 141.

In the step (S210), word lines coupled to memory cells in a memory block are grouped. As described above with respect to FIGS. 5 to 9, the number of word line groups and the number of word lines included in each word line group may be variously determined in the step (S210), if necessary. For example, when a read operation of the semiconductor memory device 100 is to be performed, a relatively larger number of word line groups may be determined. For example, when the capacity of the lookup table 141 is to be reduced and the semiconductor memory device 100 is to become more compact in size, a relatively smaller number of word line groups may be determined. After that, based on the grouped result, activation times tSTB of strobe signals used in the read operation may be determined with respect to a plurality of temperature sections for every group (S230). The activation times of the strobe signals, determined in the step (S230), may be determined through repetitive tests of the semiconductor memory device 100. That is, an optimum activation time of a strobe signal may be determined by performing the read operation while applying different activation times of strobe signal with respect to the respective temperature sections, and repeating a process of analyzing the read result. An optimum activation time of a strobe signal may be determined through repetitive tests with respect to each word line group. In the step (S250), a plurality of determined activation times tSTB are stored in the lookup table 141. Accordingly, as shown in Table 1, 2 or 3, activation times of strobe signals are stored in the lookup table 141. When a read command is received, the semiconductor memory device 100 performs the read operation, based on data stored in the lookup table 141.

Figure 12:
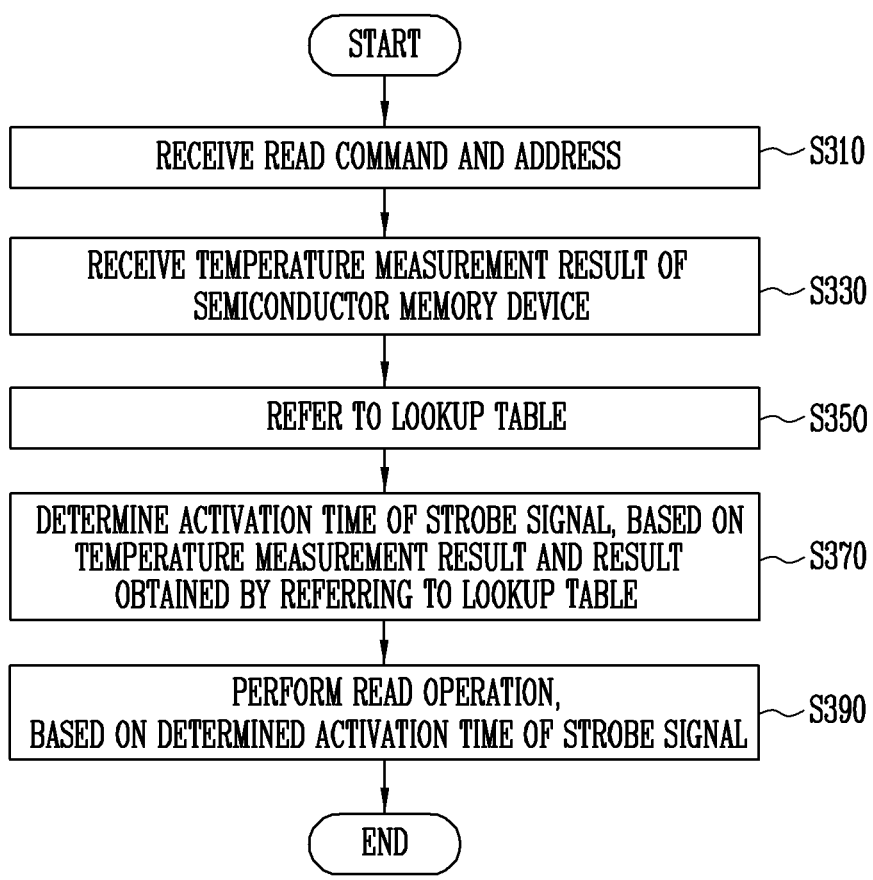
FIG. 12 is a flowchart illustrating a step of performing a read operation of the semiconductor memory device with reference to the lookup table of FIG. 10.

FIG. 12 is a flowchart illustrating a step of performing a read operation of the semiconductor memory device with reference to the lookup table of FIG. 10. As described above, steps of FIG. 12 may be performed in an actual read operation of the semiconductor memory device 100. Referring to FIG. 12, the step (S130) of performing the read operation of the semiconductor memory device 100 with reference to the lookup table may include a step (S310) of receiving a read command and an address, a step (S330) of receiving a temperature measurement result of the semiconductor memory device 100, a step (S350) of referring to the lookup table, a step (S370) of determining an activation time of a strobe signal, based on the received temperature measurement result and the result obtained by referring to the lookup table, and a step (S390) of performing the read operation, based on the determined activation time of the strobe signal.

In the step (S310), the control logic 140 receives a read command CMD and an address ADDR corresponding thereto through the input/output buffer 160. The read command and the address ADDR may be transmitted from the controller 1100 (i.e., see FIG. 13).

Subsequently, the control logic 140 may receive a current temperature measurement result of the semiconductor memory device 100 from the temperature measuring unit 170 (S330). The control logic 140 refers to the lookup table 141, based on the received address and the received temperature measurement result (S350). In particular, in the step (S350), the control logic 140 may refer to the lookup table 141, based on a block address BADD and a row address RADD in the address ADDR.

Subsequently, an activation time of a strobe signal is determined based on the result obtained by referring to the lookup table 141 (S370). For example, when the current temperature of the semiconductor memory device 100 belongs to the section Temp3 to Temp4, and the received address corresponds to the word line W19 of FIG. 5, the control logic 140 may determine the time tSTB23 as the activation time of the strobe signal STB_G2, with reference to data shown in Table 1. As described above, the semiconductor memory device 100 according to the present disclosure determines an activation time of a strobe signal according to the current temperature and the position of a word line on which the read operation is to be performed, so that the reliability of the read operation can be improved.

Next, the read operation is performed based on the activation time of the strobe signal, determined in the step (S390). In this step, the read operation described with reference to FIGS. 3 and 4 may be performed. As described above, when the current temperature of the semiconductor memory device 100 belongs to the section Temp3 to Temp4, and the received address corresponds to the word line W19 of FIG. 5, the control logic 140 may control the address decoder 120 and the read/write circuit 130, using the strobe signal STB_G2 having the time tSTB23 as the activation time, to perform the read operation on the memory cell array 110. As described above, in the semiconductor memory device 100 and the operation method thereof according to the present disclosure, different activation times of strobe signals can be applied according to the current temperature of the semiconductor memory device 100 and the position of a word line on which the read operation is to be performed. Accordingly, since an optimum strobe signal is applied to each word line, a more accurate read operation can be performed. Thus, the reliability of the semiconductor memory device and the operation method thereof can be improved.

Figure 13:
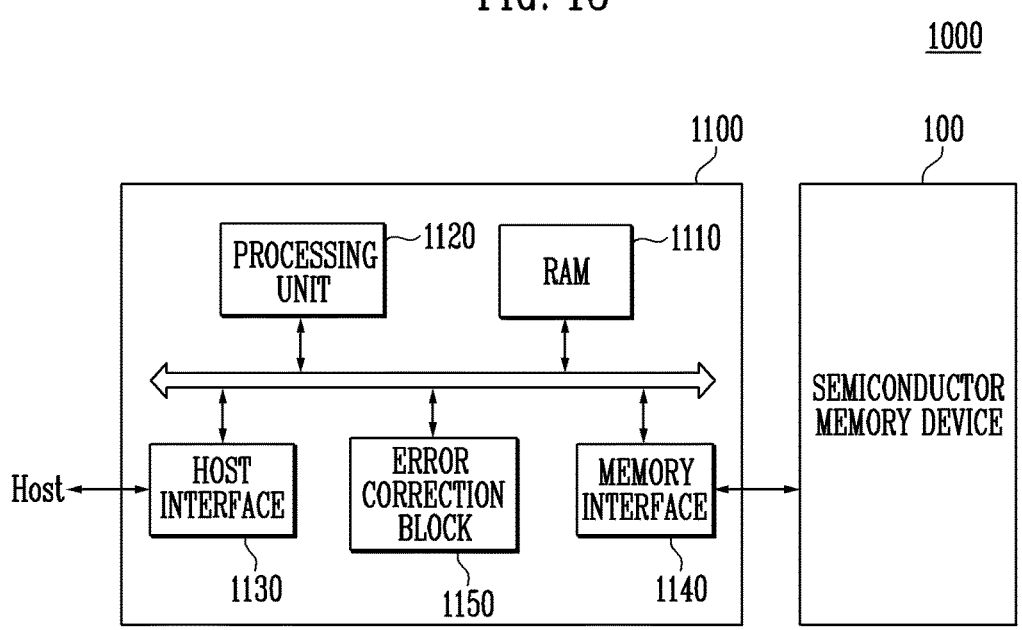
FIG. 13 is a block diagram illustrating a memory system including the semiconductor memory device of FIG. 1.

FIG. 13 is a block diagram illustrating a memory system including the semiconductor memory device of FIG. 1.

Referring to FIG. 13, the memory system 1000 includes a semiconductor memory device 100 and the controller 1100. The semiconductor memory device 100 may be the semiconductor memory device described with reference to FIG. 1. Hereinafter, overlapping descriptions will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls overall operations of the controller 1100. Also, the controller 1100 may arbitrarily store program data provided from the host Host in a write operation.

The host interface 1130 includes a protocol for exchanging data between the host Host and the controller 1100. As an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processing unit 1120 may control the semiconductor memory device 100 to adjust a read voltage, based on an error detection result of the error correction block 1150, and to perform re-reading. In an embodiment, for example, the error correction block 1150 may be provided as a component of the controller 1100.

The controller 1100 and the semiconductor memory device 100 may be integrated into one semiconductor device. In an embodiment, for example, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, for example, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 14:
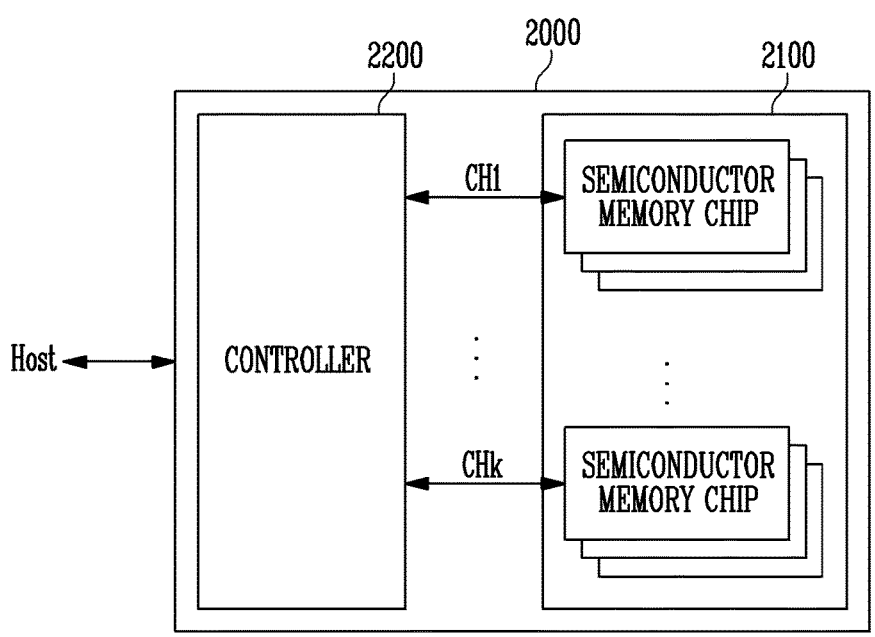
FIG. 14 is a block diagram illustrating an application example of the memory system of FIG. 13.

FIG. 14 is a block diagram illustrating an application example of the memory system of FIG. 13.

Referring to FIG. 14, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 14, it is illustrated that the plurality of groups communicate with the controller 2200 through first to kth channels CH1 to CHk. Each semiconductor memory chip may be configured and operated identically to the semiconductor memory device 100 described with reference to FIG. 1.

Each group is configured to communicate with the controller 2200 through one common channel. The controller 2200 is configured similarly to the controller 1100 described with reference to FIG. 13. The controller 2200 is configured to control the plurality of memory chips of the semiconductor memory device 2100 through the plurality of channels CH1 to CHk.

Figure 15:
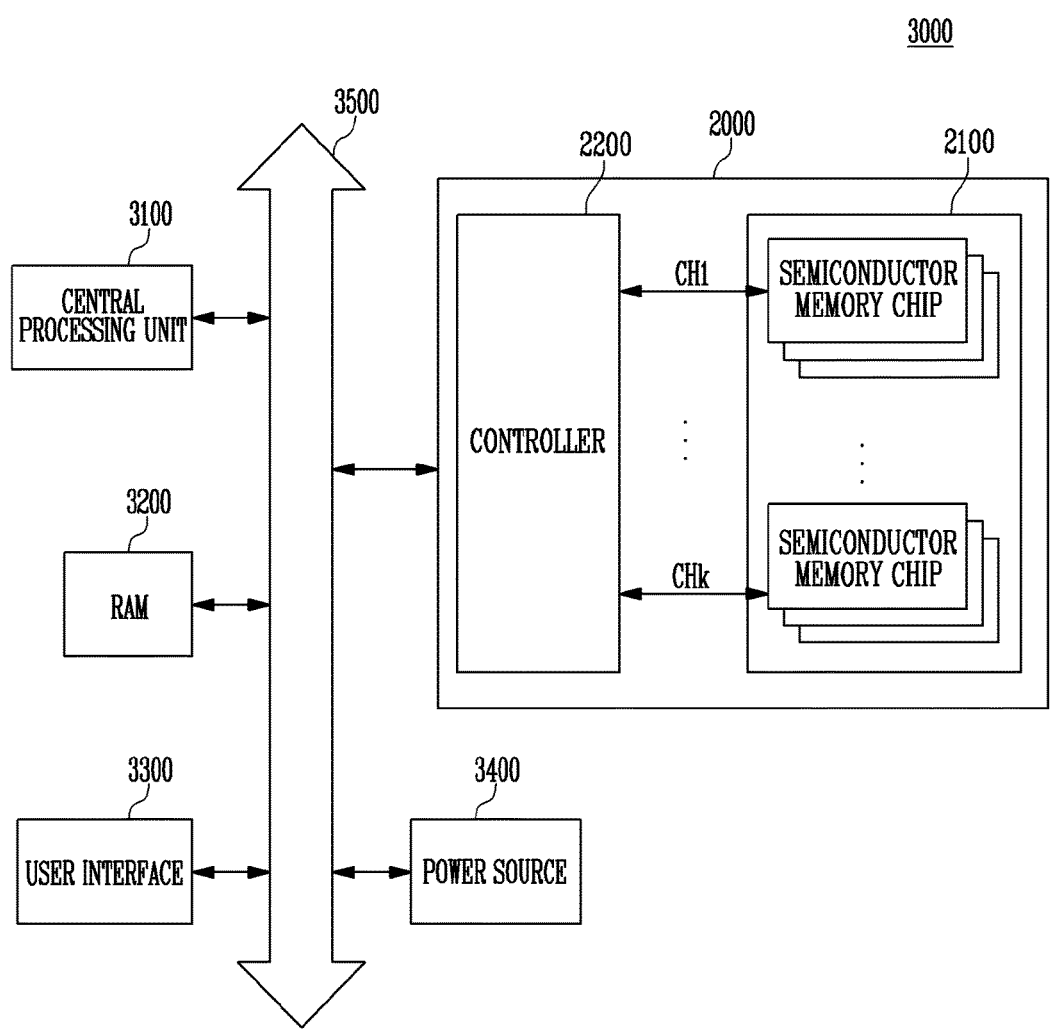
FIG. 15 is a block diagram illustrating a computing system including the memory system described with reference to FIG. 14.

FIG. 15 is a block diagram illustrating a computing system including the memory system described with reference to FIG. 14.

Referring to FIG. 15, the computing system 3000 includes a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 15, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 15, it is illustrated that the memory system 2000 described with reference to FIG. 14 is provided. However, the memory system 2000 may be replaced by the memory system 1000 described with reference to FIG. 13. In an embodiment, for example, the computing system 3000 may be configured to include both the memory systems 1000 and 2000 described with reference to FIGS. 13 and 14.

According to the present disclosure, it may be possible to provide a semiconductor memory device having improved reliability.

Also, according to the present disclosure, it may be possible to provide an operation method of a semiconductor memory device having improved reliability.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory cell array including a plurality of memory blocks;
   a read and write (read/write) circuit configured to read data from the memory cell array; and
   a control logic configured to control the read/write circuit to perform a read operation on the memory cell array,
   wherein the control logic is configured to perform a read operation by applying different activation times indicating periods in which activation states of strobe signals are maintained, according to the position of a word line connected to a memory block.

2. The semiconductor memory device of claim 1, wherein the control logic includes a lookup table that stores an activation time of a strobe signal, the activation time of the strobe signal is defined for each word line coupled to the memory block.

3. The semiconductor memory device of claim 2, wherein, when a read command and an address are received by the semiconductor memory device, the control logic determines an activation time of a strobe signal with respect to a word line corresponding to the received address, with reference to the lookup table.

4. The semiconductor memory device of claim 3, further comprising a temperature measuring unit configured to measure a temperature of the semiconductor memory device, and transmit the measured result to the control logic.

5. The semiconductor memory device of claim 4, wherein the lookup table stores an activation times of strobe signals, each of the activation times for the strobe signals are defined for each of a plurality of temperature sections.

6. The semiconductor memory device of claim 2, wherein the word lines coupled to the memory block are grouped into a plurality of groups, and
   the lookup table stores activation times of strobe signals, which are defined for each of the plurality of groups.

7. The semiconductor memory device of claim 6, wherein numbers of word lines belonging to two or more of the respective groups are the same.

8. The semiconductor memory device of claim 6, wherein the numbers of word lines belonging to two or more of the respective groups are different.

9. A method of operating a semiconductor memory device, the method comprising:
   grouping a plurality of word lines coupled to a memory block of the semiconductor memory device into a plurality of word line groups;
   determining activation times of strobe signals according to temperatures, with respect to each of the word line groups, the activation times indicating periods in which activation states of the strobe signals are maintained; and
   storing the determined activation times of the strobe signals in a lookup table of the semiconductor memory device.

10. The method of claim 9, wherein at least two or more of the word line groups determined in the grouping of the plurality of word lines coupled to the memory block of the semiconductor memory device into the plurality of word line groups include the same number of word lines.

11. The method of claim 9, wherein at least two or more of the word line groups determined in the grouping of the plurality of word lines coupled to the memory block of the semiconductor memory device into the plurality of word line groups include different numbers of word lines.

12. The method of claim 9, wherein, in the determining of the activation times of the strobe signals according to the temperatures, with respect to each of the word line groups, as a word line group becomes closer to a drain select line coupled to the memory block, a relatively longer activation time of a strobe signal is determined with respect to the word line group.

13. The method of claim 9, wherein, in the determining of the activation times of the strobe signals according to the temperatures, with respect to each of the word line groups, as a word line group becomes closer to a source select line coupled to the memory block, a relatively longer activation time of a strobe signal is determined with respect to the word line group.

14. The method of claim 9, wherein, in the determining of the activation times of the strobe signals according to the temperatures, with respect to each of the word line groups, as the temperature of the semiconductor memory device becomes greater, a relatively shorter activation time of a strobe signal is determined.

15. A method of operating a semiconductor memory device, the method comprising:
receiving a read command and an address;
receiving a temperature measurement result of the semiconductor memory device;
determining an activation time of indicating a period in which an activation state of a strobe signal is maintained, based on the temperature measurement result and the position of a word line corresponding to the address, with reference to a lookup table; and
performing a read operation, based on the determined activation time of the strobe signal.

16. The method of claim 15, wherein the lookup table stores activation times of strobe signals with respect to a plurality of word line groups.

17. The method of claim 16, wherein at least two word line groups from the plurality of word line groups include the same number of word lines.

18. The method of claim 16, wherein at least two word line groups from the plurality of word line groups include different numbers of word lines.

19. The method of claim 15, wherein the lookup table stores activation times of strobe signals, each of the activation times for the strobe signals are defined for each of a plurality of temperature sections.

20. The method of claim 19, wherein the lookup table stores a relatively short activation time of a strobe signal with respect to a temperature section of relatively high temperatures.

21. A semiconductor memory device comprising:
a plurality of memory cells coupled between word lines and bit lines;
a plurality of page buffers coupled to the bit lines, respectively, each of the page buffers configured to receive a strobe signal to read data from a memory cell in a read operation; and
a control logic configured to determine a duration in which the strobe signal maintains an activation state, based on a position of a word line coupled to a memory cell to read data from and a temperature measurement result.

22. The semiconductor memory device according to claim 21, wherein activation times of the strobe signals used for reading memory cells have the same duration if word lines coupled to the memory cells are within a same group.

23. The semiconductor memory device according to claim 22, wherein the control logic includes a lookup table to provide the same duration of activation times of the strobe signals for reading memory cells coupled to word lines that are in the same group.

24. The semiconductor memory device according to claim 21, wherein the temperature measurement result is within a temperature range including two or more temperatures associated with the duration of the activation time of the strobe signal.

25. The semiconductor memory device according to claim 24, wherein the control logic includes a lookup table to associate the temperature range with the duration of the activation time of the strobe signal.

26. A semiconductor memory device comprising:
a control logic coupled to bit lines through a read and write (read/write) circuit and to word lines through an address decoder,
wherein the control logic is configured to determine a duration in which a strobe signal for the read/write circuit is activated based on a group a word line is included in and a temperature range associated with the duration of the activation time of the strobe signal.

27. A semiconductor memory device comprising:
a plurality of memory cells coupled between word lines and bit lines;
a plurality of page buffers coupled to the bit lines, respectively, each of the page buffers configured to receive a strobe signal to read data from a memory cell in a read operation; and
a control logic configured to determine a duration in which the strobe signal maintains an activation state, based on a temperature measurement result and a group a word line is included in, the word line coupled to a memory cell from which data is to be read from by the page buffer.

* * * * *